(12) United States Patent
Maeda et al.

(10) Patent No.: US 9,125,329 B2
(45) Date of Patent: *Sep. 1, 2015

(54) ELECTRONIC COMPONENT MOUNTING LINE AND ELECTRONIC COMPONENT MOUNTING METHOD

(71) Applicant: PANASONIC CORPORATION, Osaka (JP)

(72) Inventors: Tadashi Maeda, Yamanashi (JP); Hiroki Maruo, Osaka (JP); Tsubasa Saeki, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 154 days.

This patent is subject to a terminal disclaimer.

(21) Appl. No.: 13/978,860

(22) PCT Filed: Oct. 19, 2012

(86) PCT No.: PCT/JP2012/006719
§ 371 (c)(1),
(2) Date: Jul. 9, 2013

(87) PCT Pub. No.: WO2013/084398
PCT Pub. Date: Jun. 13, 2013

(65) Prior Publication Data
US 2014/0208587 A1   Jul. 31, 2014

(30) Foreign Application Priority Data

Dec. 8, 2011 (JP) .................. 2011-268992

(51) Int. Cl.
*H05K 3/30* (2006.01)
*H05K 13/04* (2006.01)
*H05K 3/34* (2006.01)

(52) U.S. Cl.
CPC ............ *H05K 3/30* (2013.01); *H05K 3/3436* (2013.01); *H05K 13/0465* (2013.01); *H05K 2201/09909* (2013.01); *H05K 2201/10636* (2013.01); *H05K 2201/10674* (2013.01); *H05K 2203/0126* (2013.01); *Y10T 29/4913* (2015.01); *Y10T 29/53174* (2015.01)

(58) Field of Classification Search
CPC ...... B23K 1/203; H01L 24/742; H01L 24/75; H01L 24/81; H05K 3/0097; H05K 3/303; H05K 3/341; H05K 3/3468; H05K 3/3473; H05K 3/3494; Y10T 29/49128; Y10T 29/4913; Y10T 29/49149; Y10T 29/49144; Y10T 29/49155; Y10T 29/49163; Y10T 29/49169; Y10T 29/49213; Y10T 29/49224; Y10T 29/49904; Y10T 29/5196; Y10T 29/53048; Y10T 29/53091; Y10T 29/5313; Y10T 29/53187
USPC ........... 29/739, 740, 742, 743, 833, 834, 836; 348/370, 374; 700/95–97, 121; 901/17, 901/40–47
See application file for complete search history.

(56) References Cited

U.S. PATENT DOCUMENTS

| | | | |
|---|---|---|---|
| 6,789,720 B2 * | 9/2004 | Uchida et al. | 228/22 |
| 6,860,002 B2 * | 3/2005 | Oyama | 29/740 |
| 6,938,335 B2 * | 9/2005 | Kuribayashi et al. | 29/834 |
| 6,971,161 B1 * | 12/2005 | Maenishi et al. | 29/832 |
| 7,047,632 B2 * | 5/2006 | Arikado | 29/832 |
| 7,296,727 B2 * | 11/2007 | Onobori et al. | 228/180.22 |
| 8,209,858 B2 * | 7/2012 | Speckels et al. | 29/834 |
| 2003/0177633 A1 * | 9/2003 | Haji et al. | 29/743 |
| 2005/0161492 A1 | 7/2005 | Yamamoto | |
| 2009/0099678 A1 | 4/2009 | Kurata et al. | |
| 2009/0224026 A1 * | 9/2009 | Yamamoto | 228/179.1 |
| 2010/0000773 A1 | 1/2010 | Yoshinaga et al. | |
| 2010/0264196 A1 | 10/2010 | Inaba et al. | |

FOREIGN PATENT DOCUMENTS

| | | |
|---|---|---|
| EP | 1890212 A1 | 2/2008 |
| EP | 2064930 A2 | 6/2009 |
| JP | 2003-273165 A | 9/2003 |
| JP | 2005-026648 A | 1/2005 |

| | | | |
|---|---|---|---|
| JP | 2007-018505 A | 1/2007 | |
| JP | 2007-266330 A | 10/2007 | |
| JP | 2008-078431 A | 4/2008 | |
| JP | 2010-251579 A | 11/2010 | |
| WO | 2006-132282 A1 | 12/2006 | |
| WO | 2008-035819 A2 | 3/2008 | |

OTHER PUBLICATIONS

International Search Report issued in PCT/JP2012/006719, dated Nov. 20, 2012.

* cited by examiner

*Primary Examiner* — Paul D Kim

(74) *Attorney, Agent, or Firm* — McDermott Will & Emery LLP

(57) ABSTRACT

Disclosed is an electronic component mounting line on which a substrate undergoes solder paste printing, electronic component placements, and then reflow, while being moved from upstream to downstream. The line includes: a substrate feeding machine for feeding the substrate; a screen printing machine for applying solder paste to the substrate; a first electronic component placement machine for placing a first electronic component on the substrate; a resin dispensing machine for dispensing a thermosetting resin onto at least one reinforcement position arranged on the substrate; a second electronic component placement machine for placing a second electronic component on the substrate, such that its peripheral edge portion comes in contact with the thermosetting resin; and a reflow machine for bonding the first and second electronic components to the substrate, by heating and cooling the resultant. The second electronic component placement machine is arranged adjacent to and downstream of the resin dispensing machine.

4 Claims, 7 Drawing Sheets

(a)

(b)

ELECTRONIC COMPONENT MOUNTING LINE AND ELECTRONIC COMPONENT MOUNTING METHOD

RELATED APPLICATIONS

This application is the U.S. National Phase under 35 U.S.C. §371 of International Application No. PCT/JP2012/006719, filed on Oct. 19, 2012, which in turn claims the benefit of Japanese Application No. 2011-268992, filed on Dec. 8, 2011, the disclosures of which Applications are incorporated by reference herein.

TECHNICAL FIELD

The present invention relates to an electronic component mounting line and an electronic component mounting method, for mounting on a substrate, small electronic components such as chip components and large electronic components such as chip-scale packages.

BACKGROUND ART

Electronic components such as integrated circuits, resistors, and capacitors are mounted on printed circuit boards. With electronic components made more compact in recent years, electronic components mounted on one printed circuit board are increasing in number and kind. Due to demands for downsized electronic components, chip scale packages (CSPs) are placed on substrates.

A CSP has a main surface on which terminals are arranged in a regular array, and a solder bump is formed on each of these terminals. For a CSP to be surface mounted on a printed circuit board, the solder bumps formed on the terminals are made to land on electrodes called lands on the printed circuit board. This is followed by heating, reflowing, and cooling in this order, thereby creating an interconnection between the CSP and the printed circuit board. This enables the terminals on the CSP to be electrically connected to the lands on the printed circuit board, and to be bonded to the printed circuit board due to the solder.

When thermal stress generated by thermal cycles, or external force, is applied to a CSP that is surface mounted on a printed circuit board, the portion of the CSP bonded to the printed circuit board may lack sufficient strength if it is only due to solder. Moreover, connection only due to solder lacks sufficient strength against impact caused by dropping. Therefore, reinforcing resin is used to reinforce the solder-bonded portion of the CSP.

One method of reinforcing the solder-bonded portion by using reinforcing resin, is to allow an underfill material to enter the interstices between the main surface of the CSP with the solder bumps thereon and the printed circuit board. Moreover, Patent Literature 1 proposes a method of providing reinforcing resin on a printed circuit board in advance before placing thereon an electronic component such as a CSP, only at positions which correspond to those on a peripheral edge portion of the electronic component. This method is much better compared to using an underfill material, in terms of facilitating repair work on electronic components.

In addition to CSPs, the following are usually mounted on printed circuit boards: electronic chip components mounted by using solder paste, such as chip resistors and chip capacitors; and components with lead-wires such as connectors. Moreover, the facility used for mounting of such electronic components on printed circuit boards, is an electronic component mounting line which comprises in the given order: a screen printing machine for printing solder paste; an adhesive dispensing machine for dispensing an adhesive for temporary bonding; an electronic component placement machine (first electronic component placement machine) for placing small electronic chip components; an electronic component placement machine (second electronic component placement machine) for placing large electronic components including CSPs, and other kinds of electronic components such as connectors; and a reflow machine for melting solder. The accomplished configuration of such an electronic component mounting line has a history of over 20 years, and is capable of performing in one continuous flow, processes which involve: placement of electronic components of sizes ranging from miniscule to large, up to 30 millimeters square; and reflow of the resultant assembly.

PRIOR ART

Patent Literature

[Patent Literature 1] Japan Laid-Open Patent Publication No. 2008-78431

SUMMARY OF INVENTION

Technical Problem

Usually, the following steps of (1) to (5) are performed in the given order, when a conventional electronic component mounting line is utilized for mounting CSPs through solder bump bonding and other components through solder paste bonding, on a printed circuit board: (1) a printed circuit board is conveyed on the line to a screen printing machine, and this machine screen prints solder paste onto the printed circuit board at positions where electronic components are to be mounted; (2) an adhesive dispensing machine dispenses an adhesive serving as reinforcing resin, on the printed circuit board, specifically at a position corresponding to that of a peripheral edge portion of the CSP; (3) a first electronic component placement machine places the electronic components to be mounted by using solder paste, on the printed circuit board; (4) a second electronic component placement machine places CSPs, etc. on the printed circuit board; and then (5) the resultant assembly is reflowed.

However, a conventional electronic component mounting line can cause the following problem.

As illustrated in FIG. 9(a), the reinforcing resin 105 in the step (2) needs to be dispensed on the printed circuit board 101 at a reinforcement position 104 arranged close to a land 102b, with its height adjusted for contact with the CSP 210 that would later be placed on the printed circuit board 101 in the step (4). That is, the reinforcing resin 105 is adjusted in height so that it reaches an inner substrate 211 of the CSP 210, when the CSP 210 is placed on the printed circuit board 101.

Here, when the step (3) of placing the electronic components to be mounted by using solder paste comes between the steps (2) and (4), idle time is created between the steps (2) and (4), and the reinforcing resin may flow out in a planar direction during this interval. As a result, the reinforcing resin may come in contact with the solder paste that has been placed and printed on the land in the step (1), and this may cause reduced reactivity of the solder paste. Thus, there is a possibility of poor bonding due to insufficient melting of the solder during reflow, and due to insufficient wetting by and spreading of the solder. Moreover, when the reinforcing resin gradually loses its shape over time and its height becomes too low, as illustrated in FIG. 9(b), the reinforcing resin cannot come in contact with the CSP 210 when the CSP 210 is placed on the substrate. Thus, there are instances where the initial aim of reinforcement cannot be achieved.

The present invention aims to provide an electronic component mounting line and an electronic component mounting method, both capable of preventing the foregoing problem, specifically, poor quality of mounting of electronic components on a substrate due to reinforcing resin gradually flowing over time.

Solution to Problem

An electronic component mounting line of the present invention enables a substrate to undergo solder paste printing, electronic component placements, and reflow in this order, while being moved from upstream to downstream, the line comprising:

a substrate feeding machine for feeding the substrate having a first placement area for placement of a first electronic component with a solder paste between the area and the component, and a second placement area for placement of a second electronic component having solder bumps;

a screen printing machine for applying the solder paste to the first placement area of the substrate that has been fed from the substrate feeding machine;

a first electronic component placement machine for placing the first electronic component on the first placement area of the substrate to which the solder paste has been applied by the screen printing machine;

a resin dispensing machine for dispensing a thermosetting resin onto at least one reinforcement position arranged on a peripheral edge portion of the second placement area, the substrate having already undergone placement of the first electronic component on the first placement area;

a second electronic component placement machine for placing the second electronic component on the second placement area of the substrate to which the thermosetting resin has been applied, such that a peripheral edge portion of the second electronic component comes in contact with the thermosetting resin that has been applied to the reinforcement position; and a reflow machine for bonding the first and second electronic components to the substrate, by heating the substrate on which the first and second electronic components have been placed, to melt the solder paste and the solder bumps and to cure the thermosetting resin; and then cooling the substrate, the second electronic component placement machine being arranged adjacent to and downstream of the resin dispensing machine.

Moreover, an electronic component mounting method of the present invention enables a first electronic component and a second electronic component to be mounted on a substrate that is being moved from upstream to downstream on an electronic component mounting line, the first electronic component having connection terminals for solder paste connection, the second component having solder bumps, the method comprising:

a first step of preparing the substrate including: a first placement area having first electrodes for connection to the connection terminals; and a second placement area having second electrodes for connection to the solder bumps;

a second step of applying a solder paste to the first electrodes, by using a screen printing machine arranged on the electronic component mounting line;

a third step of placing the first electronic component on the substrate such that the connection terminals land on the solder paste on the corresponding first electrodes, by using a first electronic component placement machine arranged on the electronic component mounting line;

a fourth step of dispensing a thermosetting resin onto at least one reinforcement position arranged on a peripheral edge portion of the second placement area, by using a resin dispensing machine arranged on the electronic component mounting line;

a fifth step of placing the second electronic component on the substrate such that the solder bumps land on the corresponding second electrodes; and bringing the thermosetting resin that has been applied to the reinforcement position, in contact with a peripheral edge portion of the second electronic component, by using a second electronic component placement machine arranged on the electronic component mounting line; and a sixth step of bonding the first and second electronic components to the substrate by heating the substrate on which the first and second electronic components have been placed, to melt the solder paste and the solder bumps and to cure the thermosetting resin, by using a reflow machine arranged on the electronic component mounting line; and then cooling the substrate, the fifth step being performed by using the second electronic component placement machine arranged adjacent to and downstream of the resin dispensing machine.

Advantageous Effects of Invention

The electronic component mounting line and the electronic component mounting method of the present invention are both capable of preventing poor bonding at the solder-bonded portions of the electronic components. Such poor bonding is caused by the thermosetting resin, provided as a reinforcing resin, losing its shape over time and consequently spreading out or deforming.

While the novel features of the invention are set forth particularly in the appended claims, the invention, both as to organization and content, will be better understood and appreciated, along with other objects and features thereof, from the following detailed description taken in conjunction with the drawings.

DESCRIPTION OF EMBODIMENTS

First, a description will be given on a first electronic component, a second electronic component, and a substrate which constitute a substrate with electronic components mounted thereon that is produced by utilizing an electronic component mounting line of the present invention.

Figure 1:
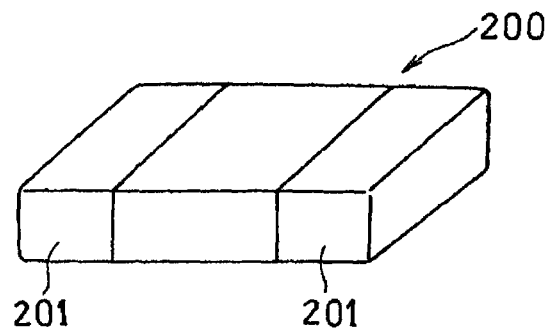
FIG. 1 is an oblique view of a first electronic component which is a chip component.

FIG. 1 is an oblique view of an example of a first electronic component 200. The first electronic component 200 has at least one connection terminal 201 bonded thereto with a solder paste. Examples of electronic components that are bonded with solder paste include: chip components as exemplified by 0402 size and 1005 size chips; and components with lead-wires such as transistors, etc. Moreover, even in the case of components with bumps, they are classified as the first electronic component if they are mounted by using solder paste and do not require reinforcement using reinforcing resin, or application (transfer) of flux to the bumps.

Figure 2A:
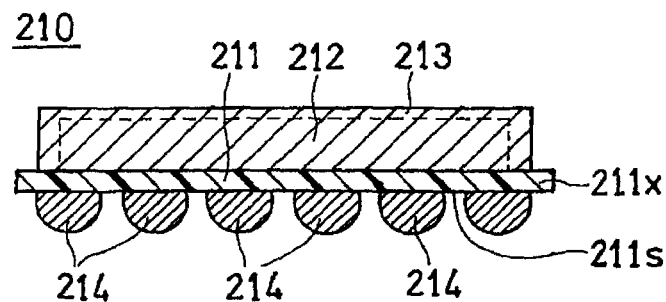
FIG. 2A is a vertical sectional view of a second electronic component having solder bumps.
Figure 2B:
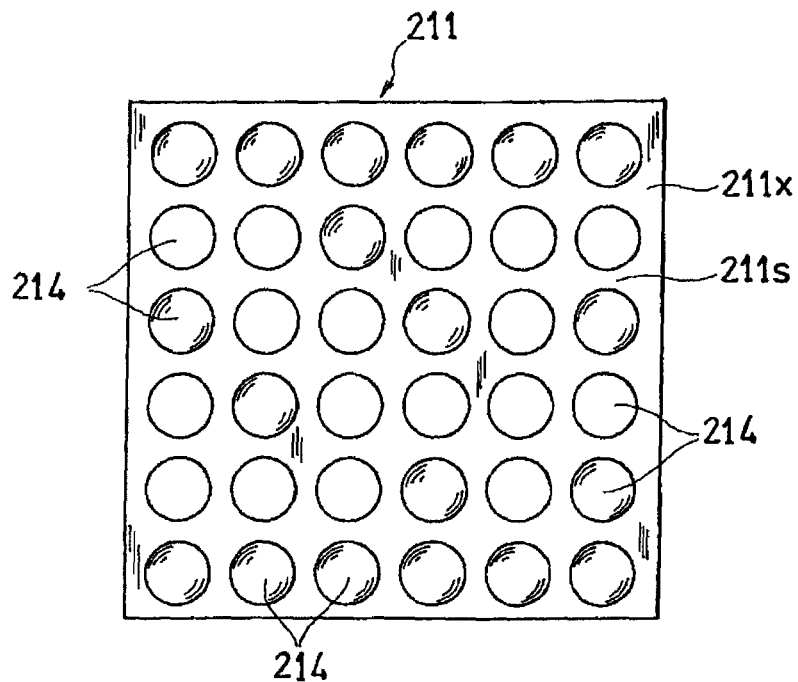
FIG. 2B is a bottom view of the second electronic component of FIG. 2A.

FIG. 2A is a vertical sectional view of an example of a second electronic component 210, and FIG. 2B is a bottom view thereof. The second electronic component 210 is a CSP comprising: a thin inner substrate 211; and a semiconductor device 212 mounted on the upper surface thereof and encapsulated with a resin sealant 213. The lower surface of the inner substrate 211 corresponds to a main surface 211s of the second electronic component 210; the main surface 211s has thereon terminals arranged in a regular array; and the terminals have thereon solder bumps 214, respectively. The second electronic component requires reinforcement using reinforcing resin; and therefore, before the second electronic component is placed on a substrate, flux is applied (transferred) to the solder bumps 214.

Figure 3:
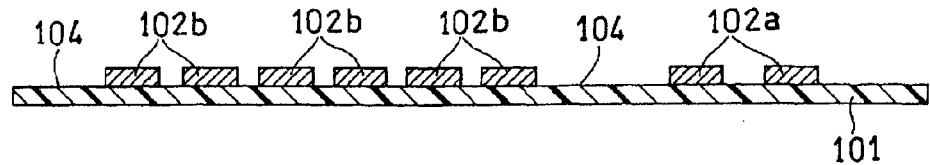
FIG. 3 is a vertical sectional view of an example of a substrate before the electronic component is placed thereon.

As illustrated in FIG. 3, the substrate 101 comprises: a first placement area and a second placement area. The first placement area has thereon first electrodes 102a for connection to the connection terminals 201 of the first electronic component 200. The second placement area has thereon second electrodes 102b for connection to the solder bumps 214, respectively, of the second electronic component 210. Arranged on a peripheral edge portion of the second placement area corresponding to a peripheral edge portion of the second electronic component 210, is at least one reinforcement position 104 for application of reinforcing resin, that is, of thermosetting resin, thereto.

On the substrate 101, usually two or more of the reinforcement positions 104 are arranged on the peripheral edge portion of the second placement area having the second electrodes 102b thereon. Here, the peripheral edge portion of the second placement area on the substrate 101 is a frame-like area which corresponds to the peripheral edge portion 211x of the main surface 211s of the second electronic component 210 to be placed on the second placement area. The reinforcement positions 104 are arranged on the frame-like area, at predetermined positions. The main surface of a typical CSP is rectangular. On the rectangular-shaped second electronic component, the reinforcement positions are preferably arranged such that they correspond to at least the four corners, or positions close thereto, of the rectangular shape.

Figure 4:
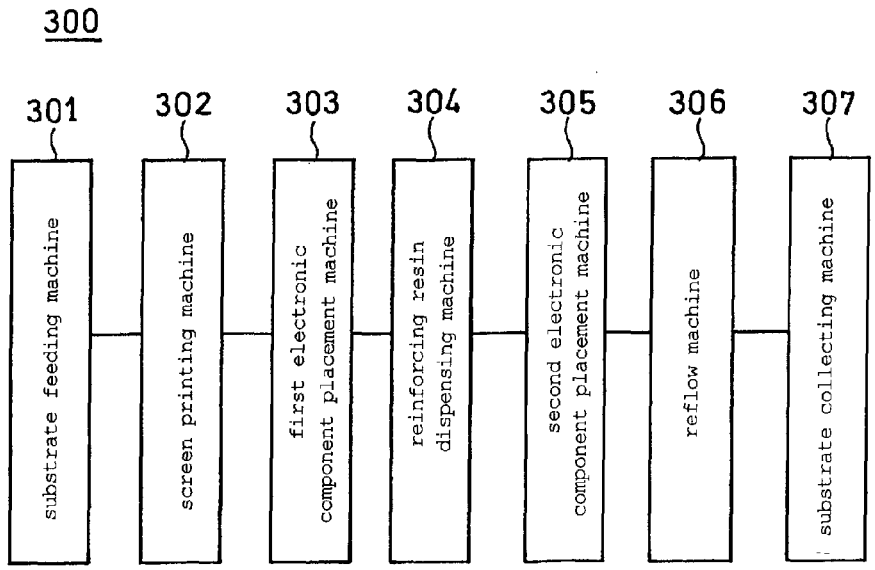
FIG. 4 is an explanatory diagram showing the overall configuration of an electronic component mounting line according to one embodiment of the present invention.

Next, a description will be given on an example of how relevant machines are arranged on the electronic component mounting line according to the present embodiment, with reference to drawings. FIG. 4 shows the arrangement of the machines, in its entirety, on the electronic component mounting line 300 according to the present embodiment.

The electronic component mounting line comprises machines that are linked to one another at their respective substrate carrying conveyors. The line enables a substrate to undergo solder paste printing, electronic component placements, reflow, etc. in this order, as the substrate is carried from upstream to downstream, by the substrate carrying conveyors that are linked to one another. The electronic component mounting line 300 of the present embodiment comprises:

(i) a substrate feeding machine 301 for feeding the substrate 101 on which the electronic components are to be mounted;

(ii) a screen printing machine 302 for applying the solder paste to the pre-selected electrodes (first electrodes 102a) provided on the first placement area of the substrate 101 that has been fed from the substrate feeding machine 301;

(iii) a first electronic component placement machine 303 for placing the first electronic component 200 on the first electrodes 102a to which the solder paste has been applied;

(iv) a reinforcing resin dispensing machine 304 for dispensing the reinforcing resin 105 onto the reinforcement positions 104 arranged on the peripheral edge portion of the second placement area of the substrate 101;

(v) a second electronic component placement machine 305 for placing the second electronic component 210 on the second placement area of the substrate 101 that comes from the reinforcing resin dispensing machine 304;

(vi) a reflow machine 306 arranged to be after the second electronic component placement machine 305, for solder bonding the first electronic component 200 and the second electronic component 210 to the substrate 101, by heating the substrate 101 to melt the solder thereon; and (vii) a substrate collecting machine 307.

Figure 5:
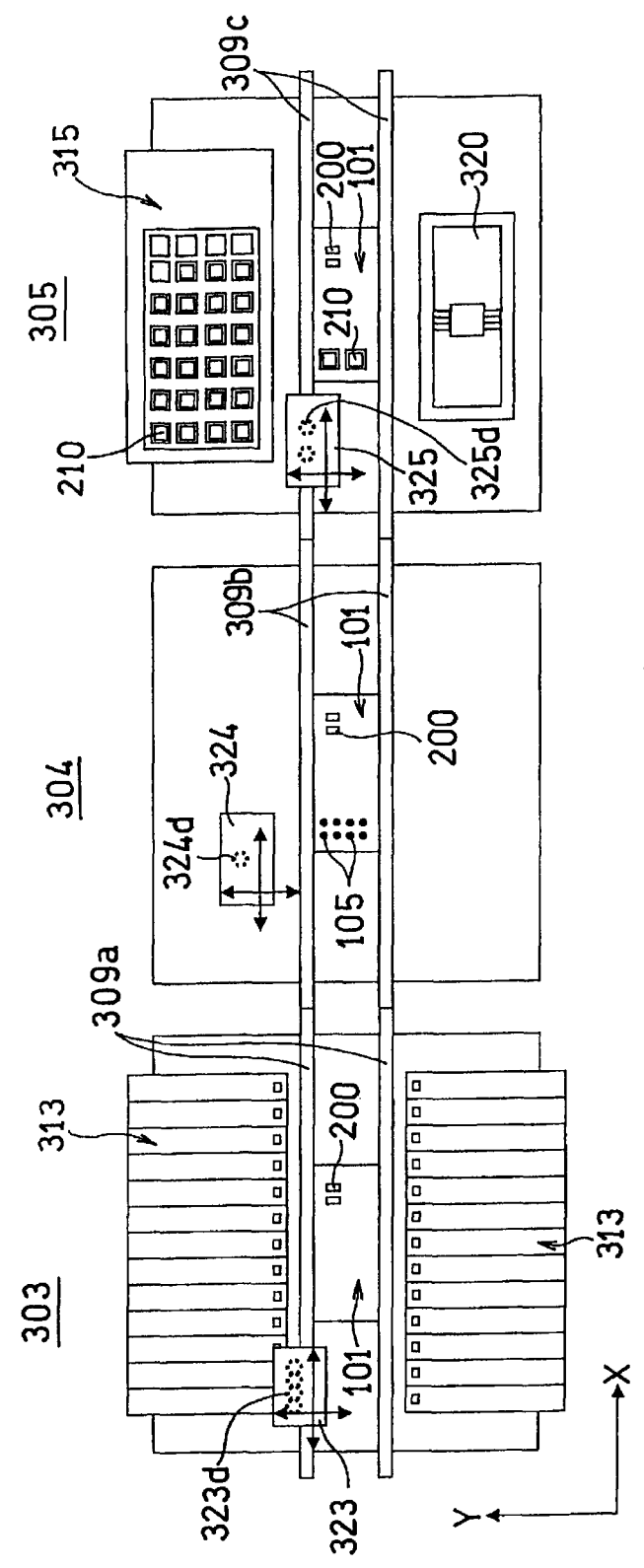
FIG. 5 is a top view of a part of the electronic component mounting line according to the embodiment of the present invention, the part having a configuration which includes a first electronic component placement machine, a reinforcing resin dispensing machine, and a second electronic component placement machine, linked in this order.

FIG. 5 is a top view of a part of the electronic component mounting line 300, the part having a configuration which includes the first electronic component placement machine 303, the reinforcing resin dispensing machine 304, and the second electronic component placement machine 305, linked in this order. As illustrated in FIG. 5, the first electronic component placement machine 303, the reinforcing resin dispensing machine 304, and the second electronic component placement machine 305 form a line for carrying the substrate 101 that comes from the screen printing machine 302. This line is formed through the attachment of the substrate carrying conveyors 309a, 309b, and 309c in this order, that are respectively provided on the corresponding machines 303, 304, and 305. The substrate carrying conveyors 309a, 309b, and 309c serve as substrate holders which carry the substrate to specific working locations within the respective machines 303, 304, and 305, and position it there where the electronic component placements and the resin dispensing are to be performed. Note that the arrow in FIG. 5 indicates the upstream-to-downstream direction in which the electronic component mounting line 300 runs.

The first electronic component placement machine 303 places the first electronic component 200 on the first electrodes 102a disposed on the substrate 101 that comes from the screen printing machine 302. The first electronic component placement machine 303 comprises: the substrate carrying conveyor 309a disposed in the middle; a first component feeding unit 313 disposed on both sides of the substrate carrying conveyor 309a; and a placing head 323. Arranged on the first component feeding unit 313, are tape feeders for feeding the first electronic component 200. The placing head 323 is supported by an X-Y movement mechanism (not illustrated). This X-Y movement mechanism is controlled by a pre-selected control unit, and enables movements of the placing head 323 to and from the first component feeding unit 313 and the substrate carrying conveyor 309a in the space thereabove.

The placing head 323 comprises a suction nozzle 323d that moves up and down due to a built-in up-and-down movement mechanism. The placing head 323 picks up the first electronic component 200 from the first component feeding unit 313, by the suction nozzle 323d moving up/down and performing suction; and then, places the first electronic component 200 on the substrate 101, by the suction nozzle 323d moving up/down and performing suction release (vacuum break) from above the first placement area of the substrate 101.

The placing head 323 places the connection terminal 201 of the first electronic component 200 on the substrate 101, such that it lands on the corresponding first electrode 102a to which the solder paste has been applied in advance.

The reinforcing resin dispensing machine 304 dispenses the reinforcing resin 105 on the substrate 101 that comes from the first electronic component placement machine 303, at the reinforcement positions 104 arranged on the peripheral edge portion of the second placement area. The reinforcing resin dispensing machine 304 comprises: the substrate carrying conveyor 309b disposed in the middle; and a dispensing head 324 having a dispensing nozzle 324d for ejecting the reinforcing resin 105. The dispensing head 324 is supported by an X-Y-Z movement mechanism (not illustrated). This X-Y-Z movement mechanism is controlled by a pre-selected control unit, and enables movements of the dispensing head 324 in a horizontal direction and up-and-down directions in the space above the substrate carrying conveyor 309b. The movements of the dispensing head 324, the ejection of the reinforcing resin 105 from the dispensing nozzle 324d, etc. are controlled by commands from the control unit.

The second electronic component placement machine 305 places the second electronic component 210 on the second electrodes 102b disposed on the substrate 101 that comes from the reinforcing resin dispensing machine 304, and it comprises: the substrate carrying conveyor 309c disposed in the middle; a second component feeding unit 315; and a placing head 325. The second electronic component placement machine 305 is arranged such that the substrate carrying conveyor 309c is attached to the substrate carrying conveyor 309b of the reinforcing resin dispensing machine 304. That is, the second electronic component placement machine 305 is arranged adjacent to and downstream of the reinforcing resin dispensing machine 304. Thus, the substrate to which the reinforcing resin has been applied by the reinforcing resin dispensing machine 304, is immediately carried to the second electronic component placement machine so that the second electronic component can be placed thereon before the reinforcing resin loses its shape. The second component feeding unit 315 is a tray feeder; and arranged thereon are trays accommodating the second electronic components 210, respectively. The placing head 325 is supported by an X-Y movement mechanism (not illustrated). This X-Y movement mechanism is controlled by a pre-selected control unit, and enables movements of the placing head 325 to and from the second component feeding unit 315 and the substrate carrying conveyor 309c in the space thereabove.

The placing head 325 comprises a suction nozzle 325d that moves up and down due to a built-in up-and-down movement mechanism. The placing head 325 picks up the second electronic component 210 from the second component feeding unit 315, by the suction nozzle 325d moving up/down and performing suction; and then, places the second electronic component 210 on the substrate 101, by the suction nozzle 325d moving up/down and performing suction release (vacuum break) from above the second placement area of the substrate 101.

Figure 6A:
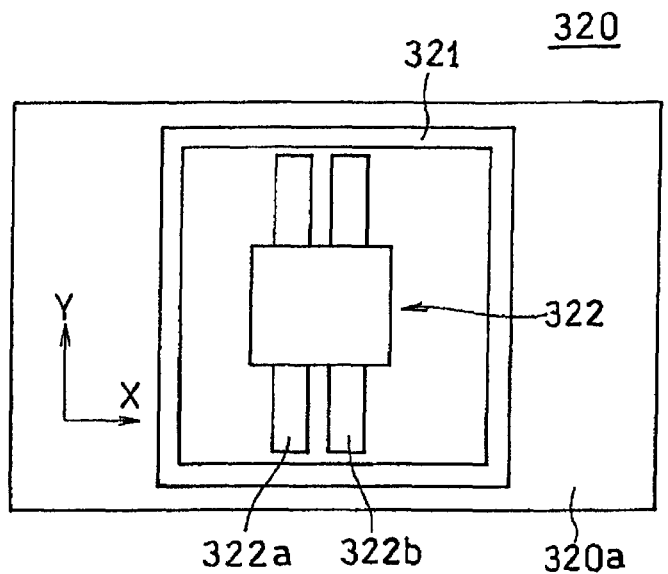
FIG. 6A is conceptual drawing of a transferring unit as seen from above, which is for forming a flux coating.
Figure 6B:
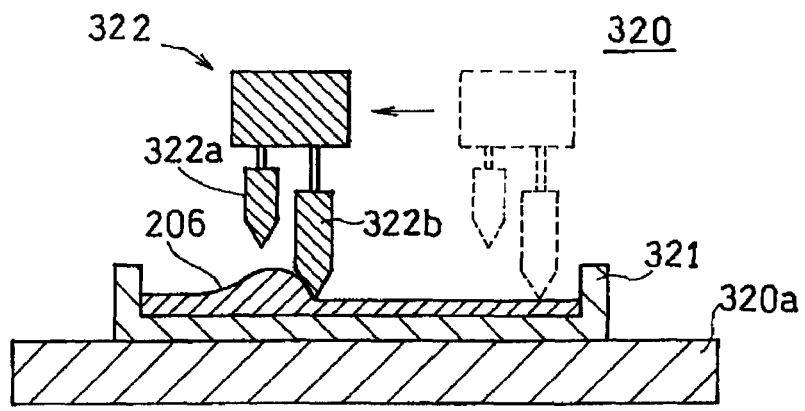
FIG. 6B is a conceptual drawing of the transferring unit of FIG. 6A in vertical section, showing how it operates when the flux coating is formed.

The second electronic component placement machine 305 includes a transferring unit 320 for forming a flux coating. The transferring unit 320 has a mechanism capable of providing the flux coating with a thickness suited for transferring the flux to the bumps 214 on the second electronic component 210. For example, as illustrated in FIG. 6A, the transferring unit 320 comprises: a base table 320a disposed at the bottom; a transferring table 321 disposed on the base table 320a; and a squeegee unit 322 disposed on the transferring table 321. The squeegee unit 322 comprises a first squeegee member 322a and a second squeegee member 322b, both with a length nearly equal to the length of the transferring table 321 in a Y-axis direction; and they are arranged in parallel to the Y-axis direction with a certain amount of space therebetween. The squeegee members can freely move up and down due to an up-and-down movement mechanism built in the squeegee unit 322. That is, they can move freely, to and fro, within the coating formed on the transferring table 321. As illustrated in FIG. 6B, the transferring unit 320 produces the flux coating by moving the squeegee units 322 in a relatively horizontal direction within the transferring table 321, so as to spread the flux on the transferring table 321 to obtain a thin layer thereof.

Figure 6C:
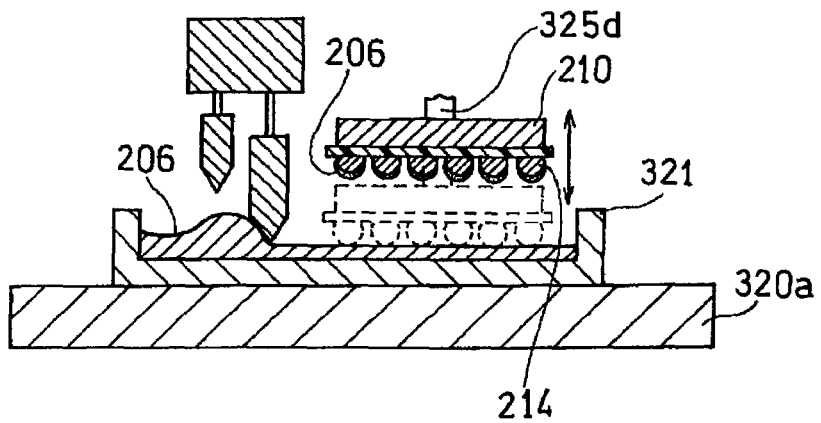
FIG. 6C is a conceptual drawing of the transferring unit of FIG. 6A in vertical section, showing when the solder bumps on the CSP are brought into contact with the flux coating, to transfer the flux to the solder bumps.

After picking up the second electronic component 210, the placing head 325 moves to a position above the transferring unit 320; and as illustrated in FIG. 6C, makes the suction nozzle 325d move down and up so that the solder bumps 214 on the second electronic component 210 come in contact with the coating of the flux 206, thereby transferring the flux 206 to the solder bumps 214. Thereafter, the placing head 325 moves to the second placement area of the substrate 101, and places the second electronic component 210 on the substrate 101, such that the solder bumps 214 land on the corresponding second electrodes 102b. Such movements of the placing head 325 are controlled by commands from a pre-selected control unit.

Next, a description will be given on the method for producing a substrate with electronic components mounted thereon, by utilizing the electronic component mounting line of the present invention.

Figure 7:
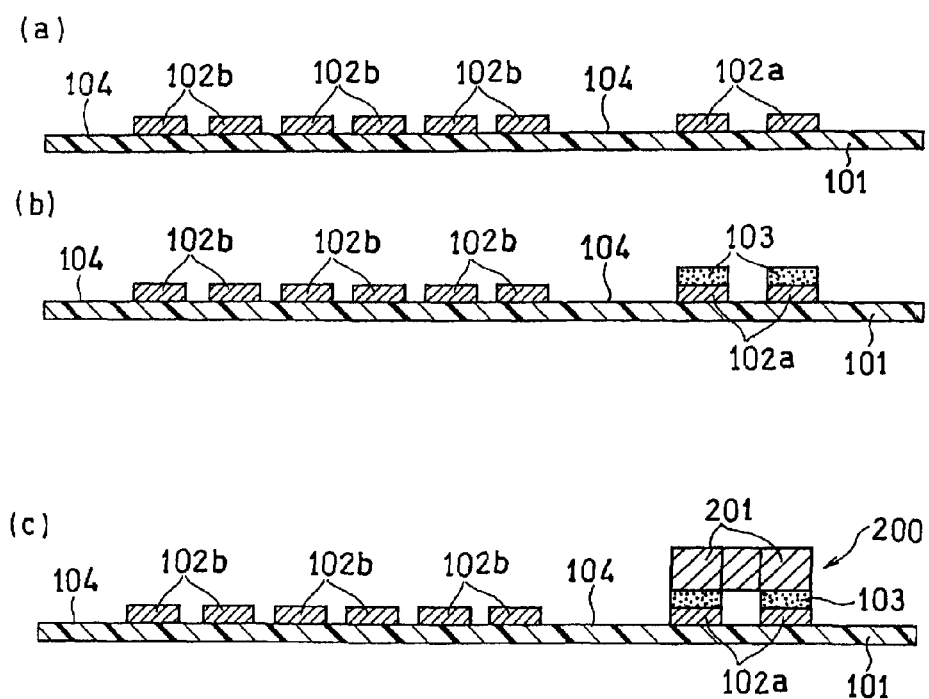
FIG. 7 is an explanatory drawing to explain the former process in an electronic component mounting method according to one embodiment of the present invention.
Figure 8:
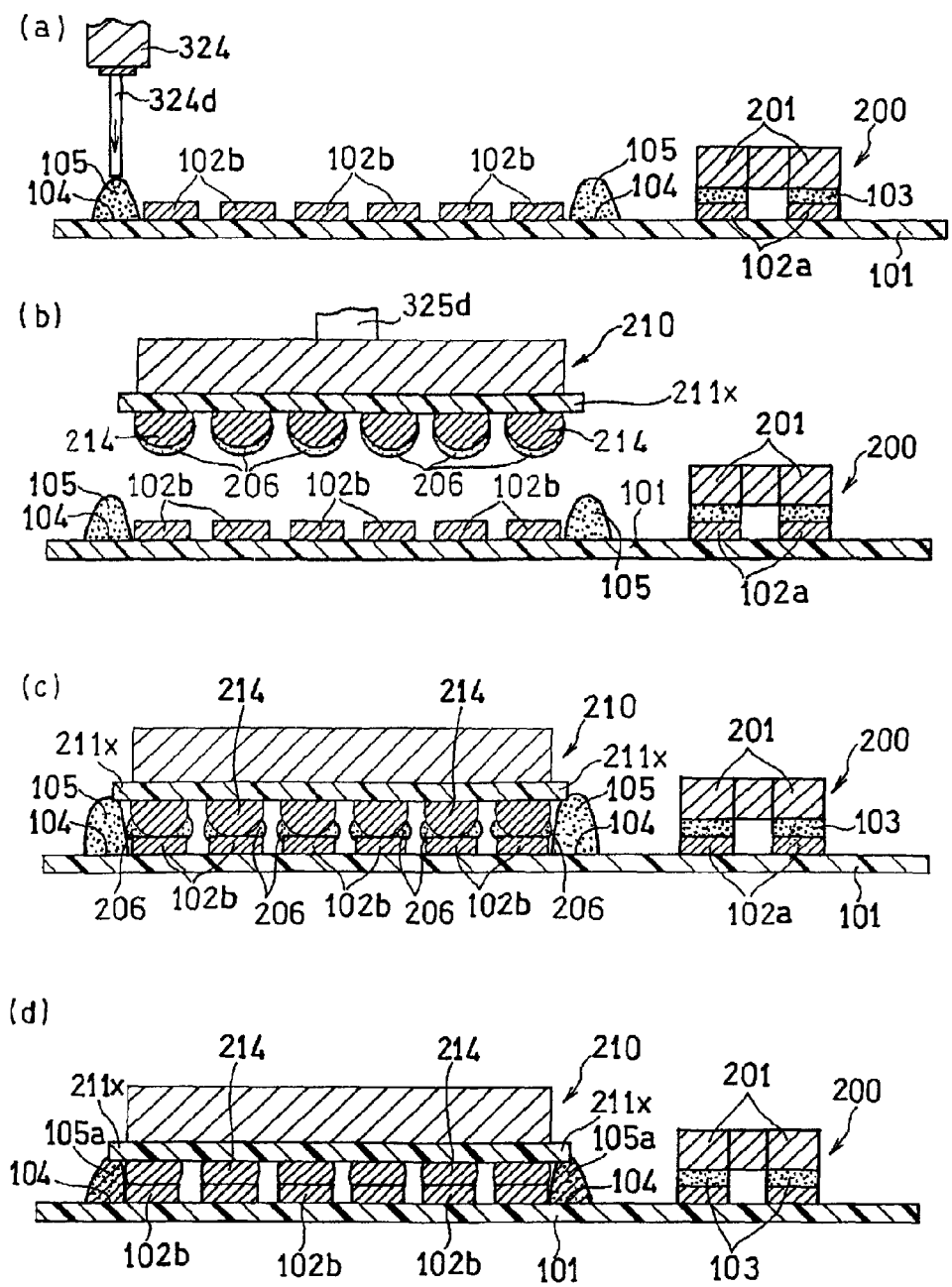
FIG. 8 is an explanatory drawing to explain the latter process in the electronic component mounting method according to the above embodiment of the present invention.

According to FIGS. 7 and 8, first, the substrate 101 with no components placed thereon as illustrated in FIG. 7(a) is carried out of the substrate feeding machine 301, and is sent to the screen printing machine 302.

Next, the screen printing machine 302 performs the solder printing process in which the solder paste 103 is printed on the pre-selected electrodes (first electrodes 102a) disposed on the substrate 101 (FIG. 7(b)). After completing printing of the solder paste, the screen printing machine 302 sends the substrate 101 to the first electronic component placement machine 303.

Next, as illustrated in FIG. 7(c), the first electronic component placement machine 303 performs a first electronic component placement process in which the first electronic component 200 is placed on the substrate 101. Specifically, the substrate carrying conveyor 309a carries the substrate 101 to a predetermined working location and positions it there; the suction nozzle 323d of the placing head 323 holds by suction, the first electronic component 200 fed from the first component feeding unit 313; and then, the placing head 323 moves in a horizontal direction to position the first electronic component 200 at the first placement area.

Next, the suction nozzle 323d moves up/down and releases the hold, so that the connection terminals 201 of the first electronic component 200 land on the solder paste that has been printed on the first electrodes 102a, thereby placing the first electronic component 200 on the substrate 101. After completing placement of the first electronic component, the first electronic component placement machine 303 drives the substrate carrying conveyor 309a and sends the substrate 101 to the reinforcing resin dispensing machine 304.

Next, as illustrated in FIG. 8(a), the reinforcing resin dispensing machine 304 performs a resin dispensing process in which the reinforcing resin 105 is dispensed on the substrate 101, at the reinforcement positions 104 arranged on the peripheral edge portion of the second placement area intended for placement of the second electronic component 210. Specifically, the substrate carrying conveyor 309b carries the substrate 101 to a predetermined working location and positions it there; the dispensing head 324 moves in a horizontal direction and positions the dispensing nozzle 324d above the reinforcement position 104; and then, the dispensing nozzle 324d dispenses the reinforcing resin 105 onto the reinforcement position 104. The dispensing pattern of the reinforcing resin 105 is not particularly limited, and for example, is dispensed onto the reinforcement positions corresponding to the four corners of the rectangular-shaped second electronic component, which are on the peripheral edge portion thereof.

Figure 9:
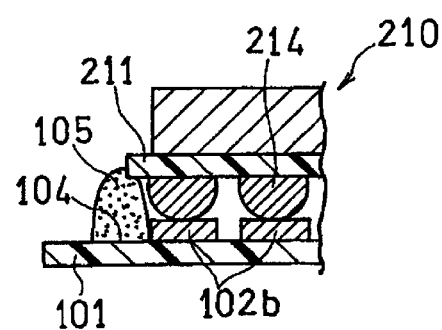
FIG. 9 is a drawing showing the second electronic component and a reinforcing resin in vertical section, to explain the relation between the two in terms of height.
Figure 9:
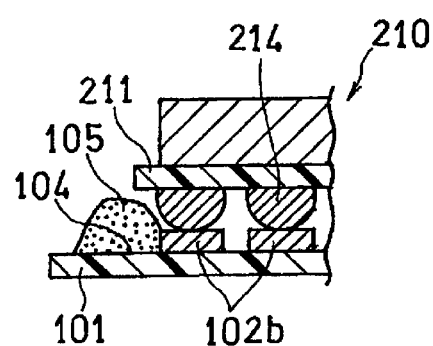

The reinforcing resin 105 is dispensed to have a height sufficient for the reinforcing resin 105 to come in contact with the inner substrate 211 which is a part of the package of the second electronic component 210 to be placed on the substrate 101 in a later process. That is, the viscosity and thixotropy of the reinforcing resin 105 are adjusted such that, as illustrated in FIG. 9(a), the height thereof is sufficient for the reinforcing resin 105 to reach the inner substrate 211 of the second electronic component 210, when the second electronic component 210 is placed on the substrate 101.

A thermosetting resin is used as the reinforcing resin. Examples of the thermosetting resin include epoxy resin, phenol resin, melamine resin, and urethane resin.

After completing dispensing of the reinforcing resin 105 onto all of the reinforcement positions 104, the reinforcing resin dispensing machine 304 drives the substrate carrying conveyor 309b and sends the substrate 101 to the second electronic component placement machine 305.

Next, as illustrated in FIG. 8(b), the second electronic component placement machine 305 performs a second electronic component placement process in which the second electronic component 210 is placed on the substrate 101. Specifically, the substrate carrying conveyor 309c carries the substrate 101 to a predetermined working location and positions it there; the suction nozzle 325d of the placing head 325 holds by suction, the second electronic component 210 fed from the second component feeding unit 315; the placing head 325 moves in a horizontal direction and positions the second electronic component 210 above the transferring unit 320 which forms the flux coating; and then, the suction nozzle 325d moves up/down while maintaining the suction, so that, as illustrated in FIG. 6C, the bumps 214 on the second electronic component 210 are brought into contact with the coating of the flux 206, thereby transferring the flux 206 to the bumps 214.

The flux 206 may be of any material as long as it is effective for removing oxides that are present on the electrode surfaces and bump surfaces at the time of solder bonding. The flux composition is not particularly limited, and for example, contains a base material such as rosin, an activator such as an organic acid or halide, a solvent, a thixotropy-promoting agent, etc. The flux may be a thermosetting flux containing a thermosetting resin component.

Subsequently, the placing head 325 moves in a horizontal direction and positions the second electronic component 210 at the second placement area; and then, as illustrated in FIG. 8(c), makes the bumps 214 on the second electronic component 210 that have been coated with the flux 206, to land on the corresponding second electrodes 102b.

Here, the reinforcing resin 105 starts to become fluid immediately after it is dispensed onto the reinforcement positions 104 by the reinforcing resin dispensing machine 304. However, since the second electronic component 210 is placed by the second electronic component placement machine arranged adjacent to and downstream of the reinforcing resin dispensing machine 304, the reinforcing resin 105 can come in contact with the peripheral edge portion 211x of the second electronic component 210, before greatly losing its shape. Moreover, by coming in contact with the second electronic component 210, the reinforcing resin 105 is able to have its fluidity suppressed. Therefore, the reinforcing resin 105 is less likely to come in contact with the solder paste that is on the first electrode 102a adjacent thereto; and is less likely to become the cause of poor bonding.

After completing placement of the second electronic component, the second electronic component placement machine 305 drives the substrate carrying conveyor 309c and sends the substrate 101 to the reflow machine 306.

Next, the reflow machine 306 performs a reflow process in which the substrate 101 is heated inside an oven to melt the solder thereon. In the reflow process, the substrate 101 on which the first electronic component 200 and the second electronic component 210 have been placed, is heated. Inside the reflow machine, the molten solder bumps and solder paste become wet and spread to the electrodes. Moreover, the reinforcing resin 105 cures, and as illustrated in FIG. 8(d), forms a resin-reinforced portion 105a. This results in obtaining a mounting structure in which the first electronic component 200 and the second electronic component 210 are bonded to the surface of the substrate 101, with the solder. During the reflow process, the reinforcing resin 105 is in contact with the second electronic component, but is not in contact with the solder paste on the first electrode; and therefore, the first electronic component 200 and the second electronic component 210 are mounted on the substrate 101 in a satisfactory manner. Thereafter, the substrate 101 is carried out of the reflow machine 306, and is collected by the substrate collecting machine 307.

The configuration of the electronic component mounting line is not limited to the foregoing embodiment, and can be changed as appropriate, as long as the second electronic component placement machine is arranged adjacent to and downstream of the reinforcing resin dispensing machine. For example, a test machine may be arranged between the screen printing machine and the first electronic component placement machine, and/or between the reflow machine and the substrate collecting machine. Alternatively, in addition to the reinforcing resin dispensing machine, an adhesive dispensing machine for dispensing an adhesive for temporary bonding of various electronic components, may be arranged downstream of the screen printing machine.

The electronic component mounting line may be configured to include two or more of the first electronic component placement machines. In this case, at least one of the first electronic component placement machines may be arranged downstream of the second electronic component placement machine. Alternatively, the electronic component mounting line may be configured to include two or more of the second electronic component placement machines. In this case, it will suffice if at least one of the second electronic component placement machines is arranged adjacent to and downstream of the reinforcing resin dispensing machine. Alternatively, the electronic component mounting line may be configured to include two or more of the combination of the reinforcing resin dispensing machine and the second electronic component placement machine arranged adjacent to and downstream thereof.

The reinforcing resin dispensing machine need not necessarily be a machine used exclusively for dispensing the reinforcing resin, and may be a multipurpose-type machine which has a function to dispense an adhesive for temporary bonding as well as other kinds of adhesives and resins.

The first electronic component placement machine may be a multipurpose-type machine having a function to place electronic components other than the first electronic component. Likewise, the second electronic component placement machine may be a multipurpose-type machine having a function to place electronic components other than the second electronic component. That is, there are no particular limitations to the kinds of machines used as the first electronic component placement machine and the second electronic component placement machine, as long as they function as intended when arranged on the electronic component mounting line.

INDUSTRIAL APPLICABILITY

According to the electronic component mounting line of the present invention, it is possible to suppress poor bonding at portions bonded by solder bumps, such poor bonding caused by thermosetting resin, provided as reinforcing resin, losing its shape over time and thus spreading or deforming. Thus, the present invention is useful in the field of surface mounting, in which pluralities of CSPs and chip components are mounted on the same substrate.

Although the present invention has been described in terms of the presently preferred embodiments, it is to be understood that such disclosure is not to be interpreted as limiting. Various alterations and modifications will no doubt become apparent to those skilled in the art to which the present invention pertains, after having read the above disclosure. Accordingly, it is intended that the appended claims be interpreted as covering all alterations and modifications as fall within the true spirit and scope of the invention.

EXPLANATION OF REFERENCE NUMERALS

101: substrate (printed circuit board)
102a: first electrode
102b: second electrode
103: solder paste
104: reinforcement position
105: reinforcing resin
200: first electronic component
201: connection terminal
210: second electronic component
211: inner substrate
211s: main surface
211x: peripheral edge portion
212: semiconductor device
213: sealing resin
214: bump
300: electronic component mounting line
301: substrate feeding machine
302: screen printing machine
303: first electronic component placement machine
304: reinforcing resin dispensing machine
305: second electronic component placement machine
306: reflow machine
307: substrate collecting machine
309a, 309b, 309c: substrate carrying conveyor
313: first component feeding unit
315: second component feeding unit
320: transferring unit
320a: base table
321: transferring table
322: squeegee unit
322a: first squeegee member
322b: second squeegee member
323: placing head
323d: suction nozzle
324: dispensing head
324d: dispensing nozzle
325: placing head
325d: suction nozzle

The invention claimed is:

1. An electronic component mounting line on which a substrate undergoes solder paste printing, electronic component placements, and reflow in recited order, while being moved from upstream to downstream, the line comprising:
a substrate feeding machine for feeding the substrate having a first placement area for placement of a first electronic component with a solder paste between the area and the component, and a second placement area for placement of a second electronic component having solder bumps;
a screen printing machine for applying the solder paste to the first placement area of the substrate that has been fed from the substrate feeding machine;
a first electronic component placement machine for placing the first electronic component on the first placement area of the substrate to which the solder paste has been applied by the screen printing machine;
a resin dispensing machine for dispensing a thermosetting resin onto at least one reinforcement position arranged on a peripheral edge portion of the second placement area, the substrate having already undergone placement of the first electronic component on the first placement area;
a second electronic component placement machine for placing the second electronic component on the second placement area of the substrate to which the thermosetting resin has been applied, such that a peripheral edge portion of the second electronic component comes in contact with the thermosetting resin that has been applied to the reinforcement position; and
a reflow machine for bonding the first and second electronic components to the substrate, by heating the substrate on which the first and second electronic components have been placed, to melt the solder paste and the solder bumps and to cure the thermosetting resin; and then cooling the substrate, the second electronic component placement machine being arranged adjacent to and downstream of the resin dispensing machine.

2. The electronic component mounting line in accordance with claim 1, wherein the second electronic component placement machine has a transferring unit for forming a flux coating, and, before placing the second electronic component on the substrate, brings the flux coating in contact with the solder bumps on the second electronic component, to transfer the flux to the solder bumps.

3. An electronic component mounting method in which a first electronic component and a second electronic component are mounted on a substrate that is being moved from upstream to downstream on an electronic component mounting line, the first electronic component having connection terminals for solder paste connection, the second component having solder bumps, the method comprising:
- a first step of preparing the substrate including: a first placement area having first electrodes for connection to the connection terminals; and a second placement area having second electrodes for connection to the solder bumps;
- a second step of applying a solder paste to the first electrodes, by using a screen printing machine arranged on the electronic component mounting line;
- a third step of placing the first electronic component on the substrate such that the connection terminals land on the solder paste on the corresponding first electrodes, by using a first electronic component placement machine arranged on the electronic component mounting line;
- a fourth step of dispensing a thermosetting resin onto at least one reinforcement position arranged on a peripheral edge portion of the second placement area, by using a resin dispensing machine arranged on the electronic component mounting line;
- a fifth step of placing the second electronic component on the substrate such that the solder bumps land on the corresponding second electrodes; and bringing the thermosetting resin that has been applied to the reinforcement position, in contact with a peripheral edge portion of the second electronic component, by using a second electronic component placement machine arranged on the electronic component mounting line; and
- a sixth step of bonding the first and second electronic components to the substrate by heating the substrate on which the first and second electronic components have been placed, to melt the solder paste and the solder bumps and to cure the thermosetting resin, by using a reflow machine arranged on the electronic component mounting line; and then cooling the substrate, the fifth step being performed by using the second electronic component placement machine arranged adjacent to and downstream of the resin dispensing machine.

4. The electronic component mounting method in accordance with claim 3,
wherein the second electronic component placement machine has a transferring unit for forming a flux coating, and
in the fifth step, before placement of the second electronic component on the substrate, the solder bumps on the second electronic component are brought in contact with the flux coating, to transfer the flux to the solder bumps.

* * * * *